US011222708B2

(12) United States Patent
Shibata et al.

(10) Patent No.: US 11,222,708 B2
(45) Date of Patent: Jan. 11, 2022

(54) SHARED ERROR DETECTION AND CORRECTION MEMORY

(71) Applicant: Micron Technology, Inc., Boise, ID (US)

(72) Inventors: Tomoyuki Shibata, Kokubuji (JP); Chikara Kondo, Hachioji (JP); Hiroyuki Tanaka, Akiruno (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/537,076

(22) Filed: Aug. 9, 2019

(65) Prior Publication Data

US 2019/0362803 A1 Nov. 28, 2019

Related U.S. Application Data

(63) Continuation of application No. 15/183,654, filed on Jun. 15, 2016, now Pat. No. 10,395,748.

(51) Int. Cl.
*G11C 29/38* (2006.01)
*G11C 29/12* (2006.01)
(Continued)

(52) U.S. Cl.
CPC .......... *G11C 29/38* (2013.01); *G11C 29/1201* (2013.01); *G11C 29/14* (2013.01);
(Continued)

(58) Field of Classification Search
CPC ..... G11C 29/38; G11C 29/1201; G11C 29/14; G11C 29/36; G11C 29/42; G11C 29/44;
(Continued)

(56) References Cited

U.S. PATENT DOCUMENTS 5,917,764 A * 6/1999 Ohsawa ................ G11C 29/72
365/200
6,801,471 B2 10/2004 Viehmann et al.
(Continued)

FOREIGN PATENT DOCUMENTS

JP 2008181633 A 8/2008
JP 2011081732 A 4/2011
(Continued)

OTHER PUBLICATIONS

EP Search Report dated Apr. 17, 2020 for EP Application No. 17813792.3, 12 pgs.
(Continued)

*Primary Examiner* — Kyle Vallecillo
(74) *Attorney, Agent, or Firm* — Dorsey & Whitney LLP

(57) ABSTRACT

Apparatuses and methods of sharing error correction memory on an interface chip are described. An example apparatus includes: at least one memory chip having a plurality of first memory cells and an interface chip coupled to the at least one memory chip and having a control circuit and a storage area. The control circuit detects one or more defective memory cells of the first memory cells of the at least one memory chip. The control circuit further stores first defective address information of the one or more defective memory cells of the first memory cells into the storage area. The interface chip responds to the first defective address information and an access request to access the storage area in place of the at least one memory chip when the access request has been provided with respect to the one or more defective memory cells of the first memory cells.

20 Claims, 17 Drawing Sheets

(51) Int. Cl.

| | |
|---|---|
| *G11C 29/00* | (2006.01) |
| *G11C 29/14* | (2006.01) |
| *G11C 29/36* | (2006.01) |
| *G11C 29/42* | (2006.01) |
| *G11C 29/44* | (2006.01) |
| *G11C 29/48* | (2006.01) |
| *G11C 5/02* | (2006.01) |
| *G11C 29/04* | (2006.01) |

(52) U.S. Cl.
CPC .............. *G11C 29/36* (2013.01); *G11C 29/42* (2013.01); *G11C 29/44* (2013.01); *G11C 29/4401* (2013.01); *G11C 29/48* (2013.01); *G11C 29/78* (2013.01); *G11C 29/846* (2013.01); *G11C 5/025* (2013.01); *G11C 2029/0407* (2013.01); *G11C 2029/1208* (2013.01); *G11C 2029/3602* (2013.01); *G11C 2029/4402* (2013.01)

(58) Field of Classification Search
CPC ..... G11C 29/4401; G11C 29/48; G11C 29/78; G11C 29/846; G11C 5/025; G11C 2029/0407; G11C 2029/1208; G11C 2029/3602; G11C 2029/4402
See application file for complete search history.

(56) References Cited

U.S. PATENT DOCUMENTS

| | | | |
|---|---|---|---|
| 7,359,261 B1 | 4/2008 | Wu et al. | |
| 8,924,903 B2 | 12/2014 | Ide | |
| 9,496,050 B2 | 11/2016 | Lam et al. | |
| 9,640,279 B1 | 5/2017 | Popps et al. | |
| 2004/0210738 A1 | 10/2004 | Kato et al. | |
| 2007/0113208 A1* | 5/2007 | Tooher | G11C 29/848 365/189.07 |
| 2007/0255983 A1 | 11/2007 | Funaba et al. | |
| 2007/0297252 A1 | 12/2007 | Singh | |
| 2008/0117696 A1 | 5/2008 | Chang et al. | |
| 2008/0141067 A1 | 6/2008 | Nautiyal | |
| 2010/0162037 A1 | 6/2010 | Maule et al. | |
| 2010/0312954 A1* | 12/2010 | Jeon | G11C 16/349 711/103 |
| 2011/0084744 A1 | 4/2011 | Nishioka et al. | |
| 2012/0069685 A1* | 3/2012 | Ide | G11C 29/802 365/189.05 |
| 2013/0176763 A1 | 7/2013 | Ware et al. | |
| 2013/0176768 A1* | 7/2013 | Wang | G11C 29/808 365/149 |
| 2013/0223171 A1 | 8/2013 | Kim et al. | |
| 2013/0336049 A1 | 12/2013 | Jurasek et al. | |
| 2013/0346671 A1* | 12/2013 | Michael | G06F 3/0679 711/103 |
| 2014/0013185 A1 | 1/2014 | Kobla et al. | |
| 2014/0146624 A1* | 5/2014 | Son | G11C 29/808 365/200 |
| 2014/0321186 A1* | 10/2014 | Ware | G11C 5/02 365/51 |
| 2014/0337573 A1 | 11/2014 | Chai et al. | |
| 2016/0379721 A1 | 12/2016 | Raj et al. | |
| 2017/0169902 A1* | 6/2017 | Chun | G06F 12/0246 |
| 2017/0365356 A1 | 12/2017 | Shibata et al. | |

FOREIGN PATENT DOCUMENTS

| | | |
|---|---|---|
| KR | 10-2000-0011182 A | 2/2000 |
| KR | 10-2004-0083525 A | 10/2004 |
| WO | 20170218227 A1 | 12/2017 |

OTHER PUBLICATIONS

KR Office Action dated Apr. 15, 2020 for KR Application No. 10-2018-7036759, 6 pgs.
International Search Report and Written Option dated Sep. 15, 2017 for PCT application No. PCT/US2017/035946.
Translation of KR Office Action dated Oct. 28, 2020 for KR Application No. 10-2020-7030188.
Translation of KR Office Action dated May 20, 2021 for KR Application No. 10-2020-7030188.
CN Office Action dated Jul. 9, 2021 for CN Appl. No. 201780037240.0.
EP Office Action dated Sep. 9, 2021 for EP Appl. No. 17813792.3.

\* cited by examiner

SHARED ERROR DETECTION AND CORRECTION MEMORY

CROSS-REFERENCE TO RELATED APPLICATION(S)

This application is a continuation of U.S. patent application Ser. No. 15/183,654 filed Jun. 15, 2016, issued as U.S. Pat. No. 10,395,748 on Aug. 27, 2019. This application and patent are incorporated by reference herein, in their entirety, and for any purposes.

BACKGROUND

High data reliability, high speed of memory access, lower power consumption and reduced chip size are features that are demanded from semiconductor memory. In recent years, three-dimensional (3D) memory devices have been introduced. Some 3D memory devices are formed by stacking chips (e.g., dice) vertically and interconnecting the chips using through substrate vias (TSVs). Benefits of the 3D memory devices include shorter interconnects which reduce circuit delays and power consumption, a large number of vertical vias between layers which allow wide bandwidth buses between functional blocks in different layers, and a considerably smaller footprint. Thus, the 3D memory devices contribute to higher memory access speed, lower power consumption and chip size reduction. Example 3D memory devices include Hybrid Memory Cube (HMC), High Bandwidth Memory (HBM), and a wide-I/O dynamic random access memory (DRAM).

For example, High Bandwidth Memory (HBM) is a type of memory including a high-performance DRAM interface and vertically stacked DRAM. A typical HBM stack of four DRAM chips (e.g., core chips) has two 128-bit channels per chip for a total of eight input output channels and a width of 1024 bits in total. An interface (I/F) chip of the HBM provides an interface with the eight input/output channels, which function independently of each other. For example, a clock frequency, a command sequence, and data can be independently provided for each channel. Thus, the eight input/output channels are not necessarily synchronous to each other.

There are several types of tests which may be performed for the HBM. For example, a type of test can be performed using a memory Built-In Self Test (mBIST) circuit that may be provided on the I/F chip. The mBIST circuit is provided for verifying failures resulting from stacking the chip. The mBIST circuit may include a memory to store defect information called an error-catch memory (ECM). Using the detect information, for example, hard repair such as blowing fuse to disconnect rows and columns with faulty bits and replacing them with redundant rows or columns may be performed.

The HBM has a post package repair function performed by using the mBIST circuit. The post package repair function uses redundancy cells for repair and these redundancy cells are normally formed in memory matrices of the core. However, the post package repair function may not be able to repair defects if the number of defective cells is greater than a number of repairable cells by providing redundancy cells. Furthermore, it may be difficult to repair one or more defective cells which are redundancy cells.

DETAILED DESCRIPTION OF PREFERRED EMBODIMENTS

Various embodiments of the present invention will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structure, logical and electrical changes may be made without departing from the scope of the present invention. The various embodiments disclosed herein are not necessary mutually exclusive, as some disclosed embodiments can be combined with one or more other disclosed embodiments to form new embodiments.

Figure 1A:
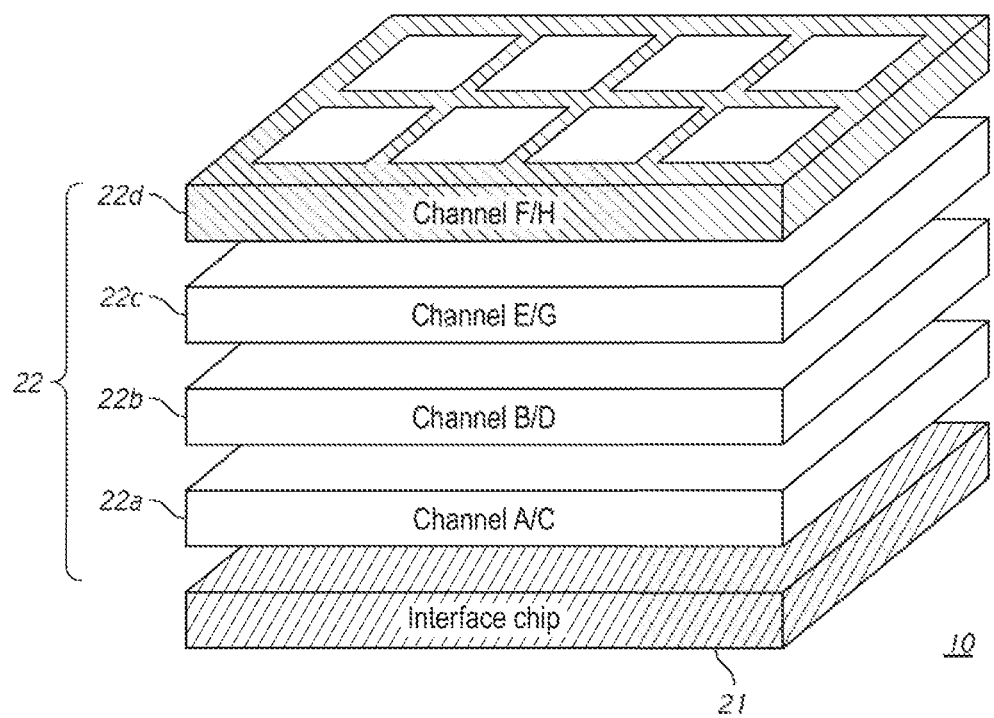
FIG. 1A is a schematic diagram of an interface (I/F) chip and a plurality of core chips in a semiconductor device in accordance with an embodiment of the present disclosure.

FIG. 1A is a schematic diagram of an interface (I/F) chip and a plurality of core chips in a semiconductor device in accordance with an embodiment of the present disclosure. For example, the semiconductor device 10 may be a 3D memory device, such as an HBM, an HMC, a Wide-IO DRAM etc. The semiconductor device is formed by stacking chips vertically, as shown in FIG. 1A. The stacked chips may include an interface chip 21 and core chips 22. In this example, each core chip 22 may be a memory chip which includes two channels. Each channel may include a plurality of memory cells and circuitries accessing the memory cells. For example, the memory cells may be DRAM memory cells.

Figure 1B:
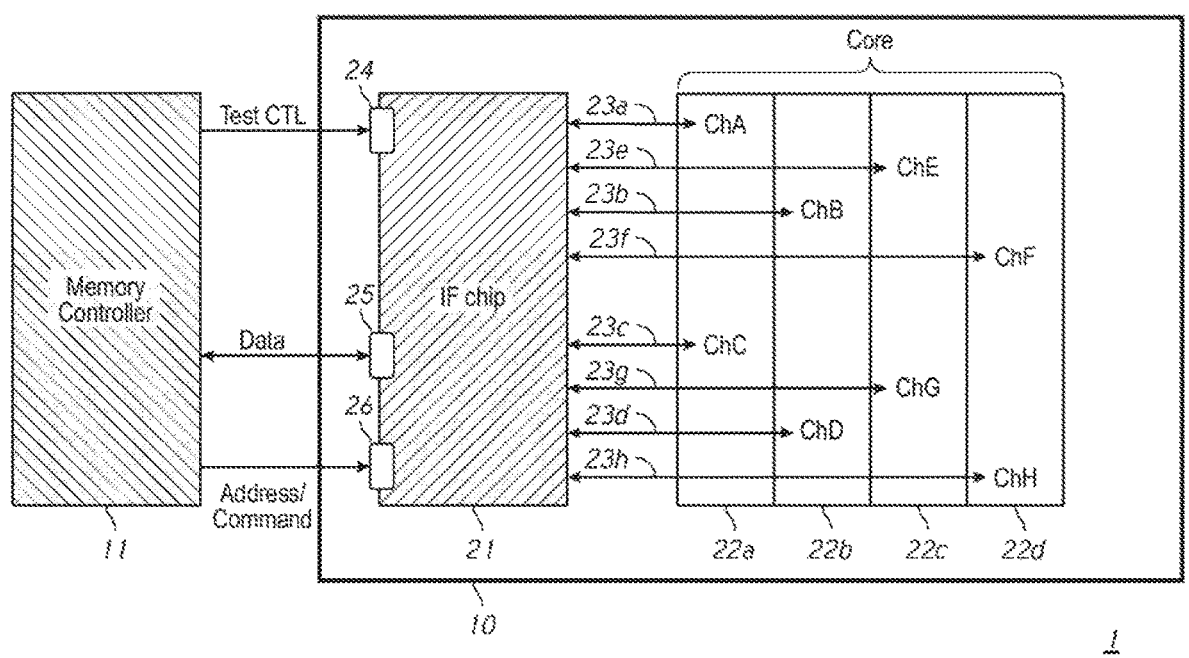
FIG. 1B is a schematic diagram of a memory system including the semiconductor device that includes the interface (I/F) chip and the plurality of core chips in accordance with an embodiment of the present disclosure.

FIG. 1B is a schematic diagram of a memory system including the semiconductor device that includes the interface (I/F) chip and the plurality of core chips in accordance with an embodiment of the present disclosure. The memory system 1 may include a memory controller 11 and the 3D memory device 10. In this example, the core chips 22a, 22b, 22c and 22d include channels A and C, channels B and D, channels E and G, and channels F and H, respectively. As shown in FIG. 1B, the channels A, B, G, D, E, F, G and H of the core chips 22 may be coupled to the I/F chip 21 via different signal lines 23a, 23b, 23c, 23d, 23e, 23f 23g, and 23h, respectively. The I/F chip 21 may include test control terminals 24, data terminals 25 and access signal terminals 26 which receive corresponding signals from a memory controller 11. For example, the test control terminals 24 may receive test control signals. The data terminals 25 may receive write data from the memory controller 11 or may transmit read data to the memory controller 11. The access signal terminals 26 may receive access signals from the memory controller 11. The access signals may include an operation command (e.g., a read command, a write command) and address information corresponding to the operation command.

Figure 2:
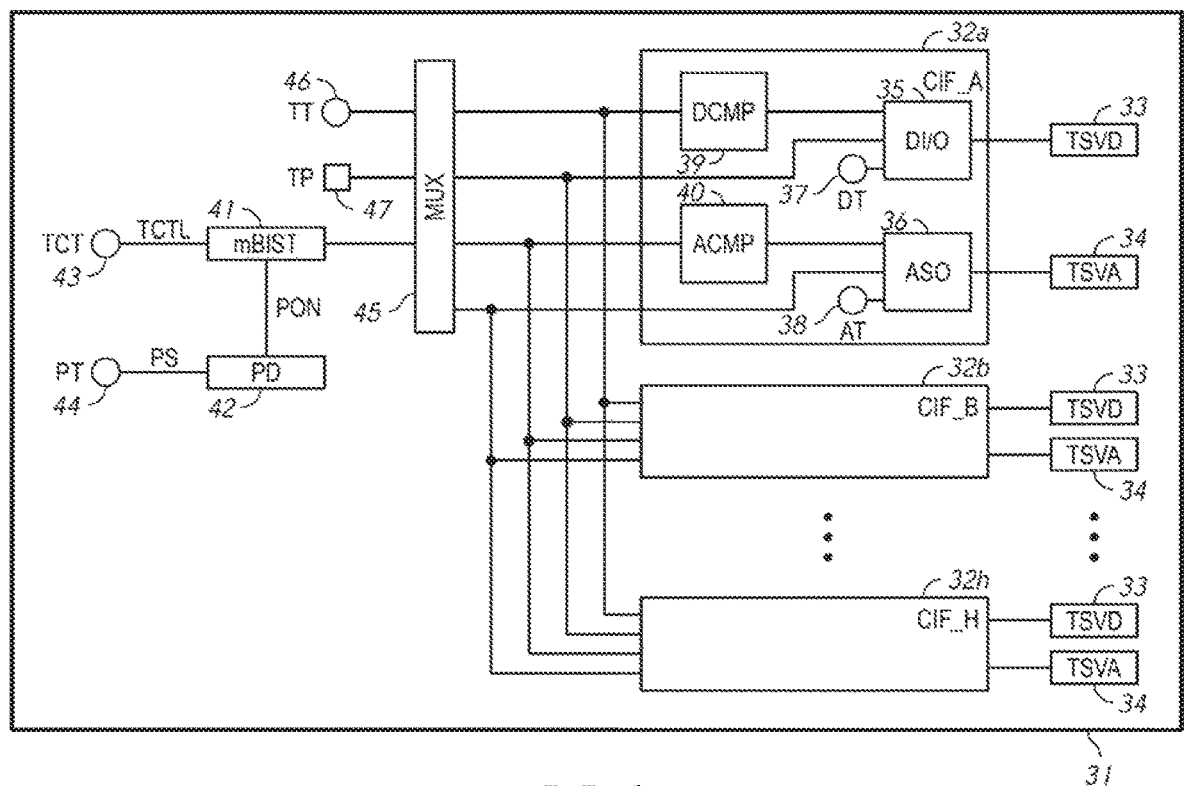
FIG. 2 is a block diagram of the I/F chip in the semiconductor device in accordance with an embodiment of the present disclosure.

FIG. 2 is a block diagram of an interface circuit on the I/F chip 21 in the semiconductor device in accordance with an embodiment of the present disclosure. An interface circuit 31 is provided on the I/F chip 21. The interface circuit 31 may include channel interface blocks CIF_A 32a, CIF_B 32b, . . . and CIF_H 32h which are coupled to corresponding channels, channel A, channel B, . . . and channel H of the core chip 22 in FIG. 1B. Furthermore, the interface circuit 31 may include a plurality of data through substrate vias, TSVDs 33 and access through substrate vias TSVAs 34. The TSVDs 33 and TSVAs 34 are configured to couple the channel interface blocks CIF_A 32a, CIF_B 32b, . . . and CIF_H 32h to the channels, channel A, channel B, . . . and channel H of the core chip 22 in FIG. 1B, respectively. In one embodiment, each signal line 23 in FIG. 1B may include the corresponding TSVD 33 and TSVA 34 for each channel. Each channel interface block of the channel interface blocks CIF_A 32a, CIF_B 32b, . . . and CIF_H 32h may include a data input/output circuit DI/O 35 and an access signal output circuit ASO 36. Each DI/O 35 may receive data from the coupled channel via the corresponding TSVD 33. The DI/O 35 may be further coupled to data terminals DT 37. The data terminals DT 37 may be the data terminals 25 in FIG. 1B. The ASO 36 may be coupled to access signal terminals AT 38. The access signal terminals AT 38 may receive access signals including access requests provided externally (e.g., from the memory controller 11 of FIG. 1B). Each access request may include a command including an operation requested (e.g., a read request, a write request, etc.) and an address where the operation requested by the command is operated. The access signal terminals AT 38 may be the access signal terminals 26 in FIG. 1B. Each ASO 36 may provide the access requests as command signals and address signals, for example, to the coupled channel via the corresponding TSVA 34. In a normal read operation, a read request and corresponding address information are externally provided to the ASO 36 via the AT 38. The ASO 36 may provide the read request and the corresponding address information to the coupled channel via the TSVA 34, responsive to the read request. The coupled channel may provide the data to the DI/O 35 via the TSVD 33 in response to the read request and the corresponding address information. The DI/O 35 may provide the data via the DT 37. Similarly, in a normal write operation, a write request and corresponding address information are externally provided to the ASO 36 via the AT 38. The ASO 36 may provide the write request and the corresponding address information to the coupled channel via the TSVA 34, responsive to the write request. At the same time, the DI/O 35 may receive write data from the DT 37 and provide the write data to the coupled channel via the TSVD 33 responsive to the write request and the corresponding address information. Each of the channel interface blocks CIF_A 32a, CIF_B 32b, . . . and CIF_H 32h may further include a data comparator circuit DCMP 39 and an access signal comparator circuit ACMP 40. Functionalities of the DCMP 39 and the ACMP 40 will be provided later in detail.

The interface circuit 31 may further include a memory built-in self-test block mBIST 41. The mBIST 4) may provide test signals to the channel interface blocks CIF_A 32a, CIF_B 32b, . . . and CIF_H 32h via a multiplexer MUX 45 in order to perform test operations on each channel responsive to test control signals TCTL. The TCTL are externally provided via test control terminals TCT 43. The TCT 43 may be the test control terminals 24 in FIG. 1B. The mBIST 41 may perform defective cell detection and repair functions during an initialization operation and a normal operation following the initialization operation, such as read and write operations, as well as during a test operation. Functionalities of the mBIST 41 will be provided later in detail. The interface circuit 31 may further include a power detection circuit PD 42. The PD 42 may provide a power on signal PON to the mBIST 41 responsive to power supply PS externally provided via a power terminal PT 44. The mBIST 41 may start the initialization operation in response to the PON. The interface circuit 31 may further include test terminals TT 46 and test pads TP 47. The TT 46 may be coupled to a socket or the like in order to couple an external tester (not shown) to the interface circuit 31. The TP 47 may couple an external tester (not shown) having a probe card interface, for example, to the interface circuit 31. The TP 47 may be used for a test during wafer process. The MUX 45 may select one of the TT 46, the TP 47 and the mBIST 41 as a source of the test signals and provide the test signals to the channel interface blocks CIF_A 32*a*, CIF_B 32*b*, . . . and CIF_H 32*h*.

In FIG. 2, the terminals, such as the DT 37, the AT 38, the TCT 43, the PT 44 and the TT 46 represented by circles may be formed by micro bump electrodes, for example. The test pad TP 47 may be formed by a pad electrode, for example. Each of the DT 37, the AT 38, the TCT 43, the PT 44 and the TT 46 may include one or more terminals. The TP 47 may include one or more pads.

Figure 3:
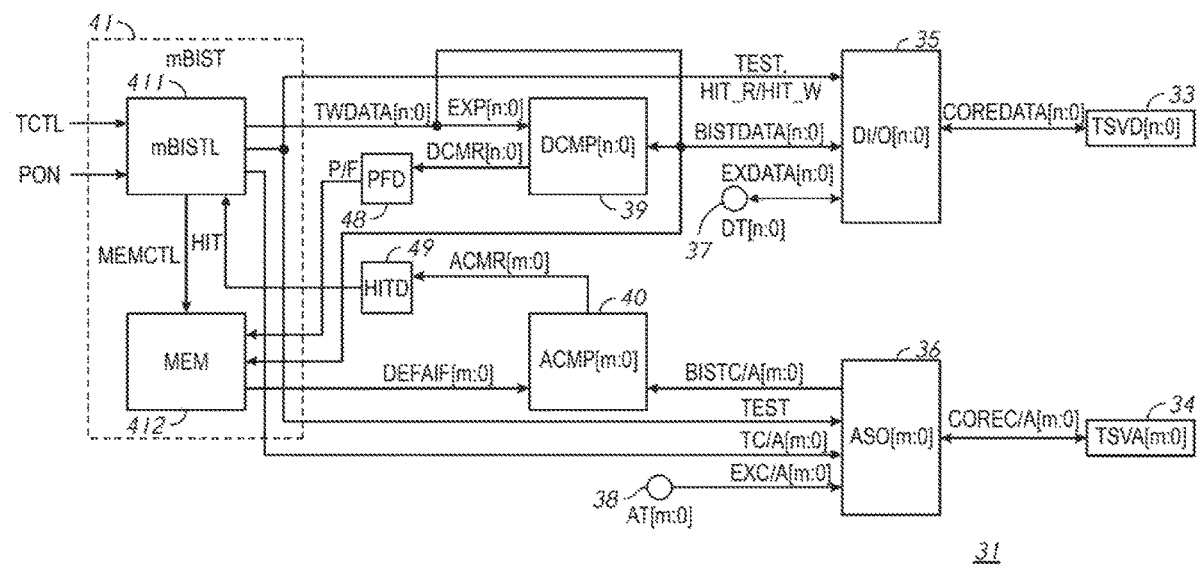
FIG. 3 is a block diagram of the interface circuit in FIG. 2 including a memory Built-In Self Test (mBIST) circuit in the semiconductor device in accordance with an embodiment of the present disclosure.

FIG. 3 is a block diagram of the interface circuit 31 in FIG. 2 including the memory Built-In Self Test (mBIST) circuit 41 in the semiconductor device in accordance with an embodiment of the present disclosure. FIG. 3 shows a connection between mBIST 41 of FIG. 2 and one of the channel interface blocks CIF_A 32*a*, CIF_B 32*b*, . . . and CIF_H 32*h* of FIG. 2 as an example. The other channel interface blocks may be coupled to the mBIST 41 similarly as shown in FIG. 3. The interface chip may include a plurality of TSVD[n:0] 33 and corresponding DI/O[n:0] 35, DT[n:0] 37 and DCMP[n:0] 39 provided with a single channel. Similarly, the interface chip may include a plurality of TSVA[m:0] 34, ASO[m:0] 36, AT[m:0] 38 and ACMP [m:0] 40 provided with a single channel. In FIG. 3, "m" is a number of bits for command/address signals and "n" is a number of bits for data signals, and "m" and "n" may be different from each other. The mBIST 41 may include an mBIST logic circuit mBISTL 411 and a storage area MEM 412. The mBISTL 411 may be a control circuit, such as an algorithmic pattern generator (APG), which may control operations of the mBIST 41. The MEM 412 may be a single memory circuit. Alternatively, the MEM 412 may be a plurality of memory circuits, each of which may perform independent functions individually. For example, the MEM 412 may include error catch memories (ECMs) and microcode memories (MCMs). For example, each of the ECMs and the MCMs may include static random access memories (SRAMs). The MCMs may store microcodes. The microcodes may represent test patterns for testing the memory cells of the core chips. The mBISTL 411 may perform test operations in accordance with the microcodes. The ECMs may store defective address information during the test operations. For example, the MEM 412, such as the ECMs and/or the MCMs, can be used as spare cells for repairing defective memory cells in the core chips 22 as described later in detail. In some embodiments, the I/F chip 21 may further include a read only memory (ROM) to store the microcodes. In another embodiment, initial states of the MCMs in the MEM 412 may represent the microcodes.

In one embodiment, the mBIST 41 may operate during the test operations. The mBIST 41 may further operate during the initialization operation and the normal operation. In particular, the mBIST 41 may detect one or more defective cells among memory cells of core chips 22. Upon detection of the one or more defective cells, the mBIST 41 may store address information for the defective cells in one portion of the MEM 412, for example the ECMs and/or MCMs, during the initialization operation. Furthermore, in the normal operation, the mBIST 41 may use an other portion of the MEM 412, for example, the ECMs and/or MCMs, to replace the defective cells with the other portion of the MEM 412 which may serve as spare memory. In other words, the mBIST 41 may redirect access to the defective cells of the core chips 22 to the other portion of the MEM 412.

In some embodiments, each of the core chips 22 may further include a defective address storing circuit, such as anti-fuses and spare memory cells. When the core chips 22 include the defective address storing circuit, the other portion of the MEM 412 of the I/F chip 21 and the spare memory cells of the core chips 22 may be used for repairing different defective cells from each other. In some embodiments, the other portion of the MEM 412 of the I/F chip 21 may replace the defective cells of the spare memory cells of the core chips 22. The detailed operation of the mBIST 41 and the channel interface block 32 during each of the test operation, the initialization operation and the normal operation including a read operation or a write operation are described below.

1) Test Operation

Figure 4A:
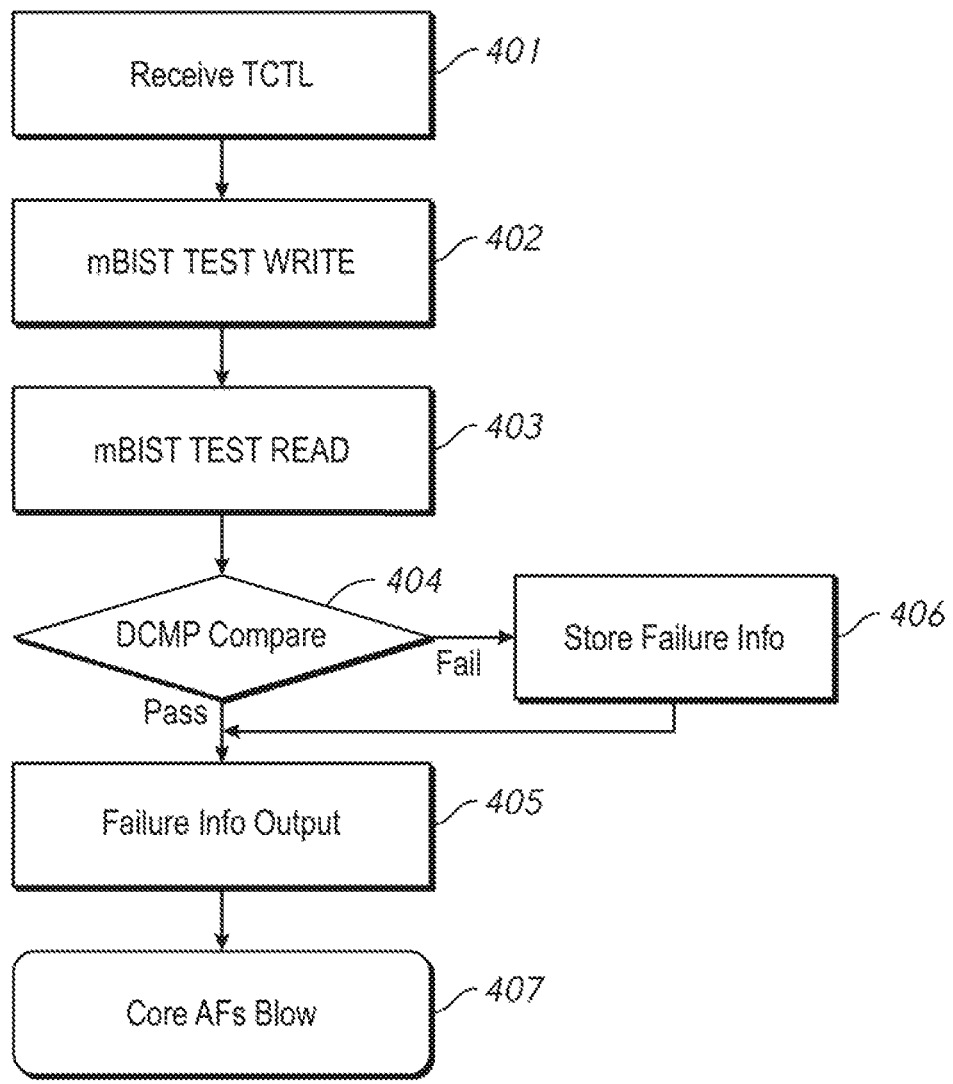
FIG. 4A is a simplified flow diagram of a test operation process by the mBIST in FIG. 3 in the semiconductor device in accordance with an embodiment of the present disclosure.

FIG. 4A is a simplified flow diagram of a test operation process by the mBIST in FIG. 3 in the semiconductor device in accordance with an embodiment of the present disclosure. For example, the test operation process may be performed by the mBIST before shipping.

In an operation block 401, the mBIST 41 may receive the test control signals TCTL externally provided through the test control terminals TCT 43. The test control signals may include a test instruction. In response to the TCTL, the mBISTL 411 may execute the microcodes to perform a test operation. In some embodiments, the microcodes may be prestored on the MCMs or a ROM of the I/F chip 21 as their initial states. In other embodiments, the MCMs may store the microcodes externally provided. The mBISTL 411 may provide a test enable signal TEST to the DI/O[n:0] 35 and the ASO[n:0] 36. The DI/O[n:0] 35 may couple, in response to the TEST, the TSVD[n:0] 33 to a BISTDATA node coupled to the DCMP[n:0] 39 and the mBIST 41 while decoupling the external data terminal DT[n:0] 37 from the DCMP[n:0] 39 and the mBIST 41. Similarly, the ASO[m:0] 36 may couple, in response to the TEST, the TSVA[m:0] 34 to a BIST command and address node BISTC/A coupled so the ACMP[m:0] 40 and the mBIST 41 while decoupling the external access terminal AT[m:0] 38 from the ACMP[m:0] 40 and the mBIST 41. The detailed description of the DI/O[n:0] 35 and the ASO[m:0] 36 will be provided later referring to FIGS. 5 and 6.

In an operation block 402, the mBISTL 411 may provide test write data TWDATA[n:0] to the DI/O[n:0] 35. The mBISTL 411 may provide a test command address signal TC/A[m:0] including test write commands and test address information to the ASO[m:0] 36. Accordingly, the DI/O[n:0] 35 and the ASO[m:0] 36 may perform test write operations on the respective channel. For example, the DI/O[n:0] may provide the TWDATA[n:0] as core data COREDATA[n:0] to the TSVD[n:0] 33. The ASO[m:0] 36 may provide the TC/A[m:0] as a core command and address signal COREC/ A[m:0] to the TSVA[m:0] 34.

After the COREDATA[n:0] are stored in memory cells desisted by the COREC/A[m:0] in the respective channel of the core chips 22, the mBISTL 411 may provide the test command/address signal TC/A[m:0] test including read commands and test address information to the ASO[m:0] 36 to perform test read operations in an operation block 403. The mBISTL 411 may provide a memory control signal MEMCTL including the test address information TA to the MEM 412. Accordingly, the ASO[m:0] 36 may provide the COREC/A[m:0] including the test read commands and the test address information to the respective channel via the TSVA[m:0] 34. The respective channel may provide the COREDATA[n:0] including test read data to the TSVD[n:0]

33 responsive to the COREC/A[m:0]. The DI/O[n:0] 35 may receive the test read data and provide the test read data to the DCMP[n:0] 39.

In an operation block 404, the DCMP[n:0] 39 may compare the test read data with the expected data EXP[n:0] that is the corresponding test write data provided from the mBISTL 411. The DCMP[n:0] 39 may provide a comparison result DCMR[n:0] to an error detection circuit PFD 48. If at least one DCMR[n:0] is indicative of data discrepancy between the test read data and the EXP[n:0], the PFD 48 may provide an active fail detection signal P/F (e.g., at a logic high level) in an operation block 406. If there is no data discrepancy between the test read data and the EXP[n:0] for all the DCMR[n:0], the PFD 48 may provide an inactive P/F (e.g., at a logic low level). In response to the active P/F, the MEM 412 may store the corresponding test address information as defective address information in an operation block 406.

After testing the memory cells of the respective channel, determined defective address information stored in the MEM 412 may be programed into a defective address storing circuit, for example anti-fuses, of the core chips 22 in an operation block 407. The determined defective address information may be read out from the MEM 412 to an external tester or an external controller (not shown) before programming in an operation block 405. The programing of the defective address information may be performed by mBISTL 411 or externally by the tester or the controller.

2) Initialization Operation

Figure 4B:
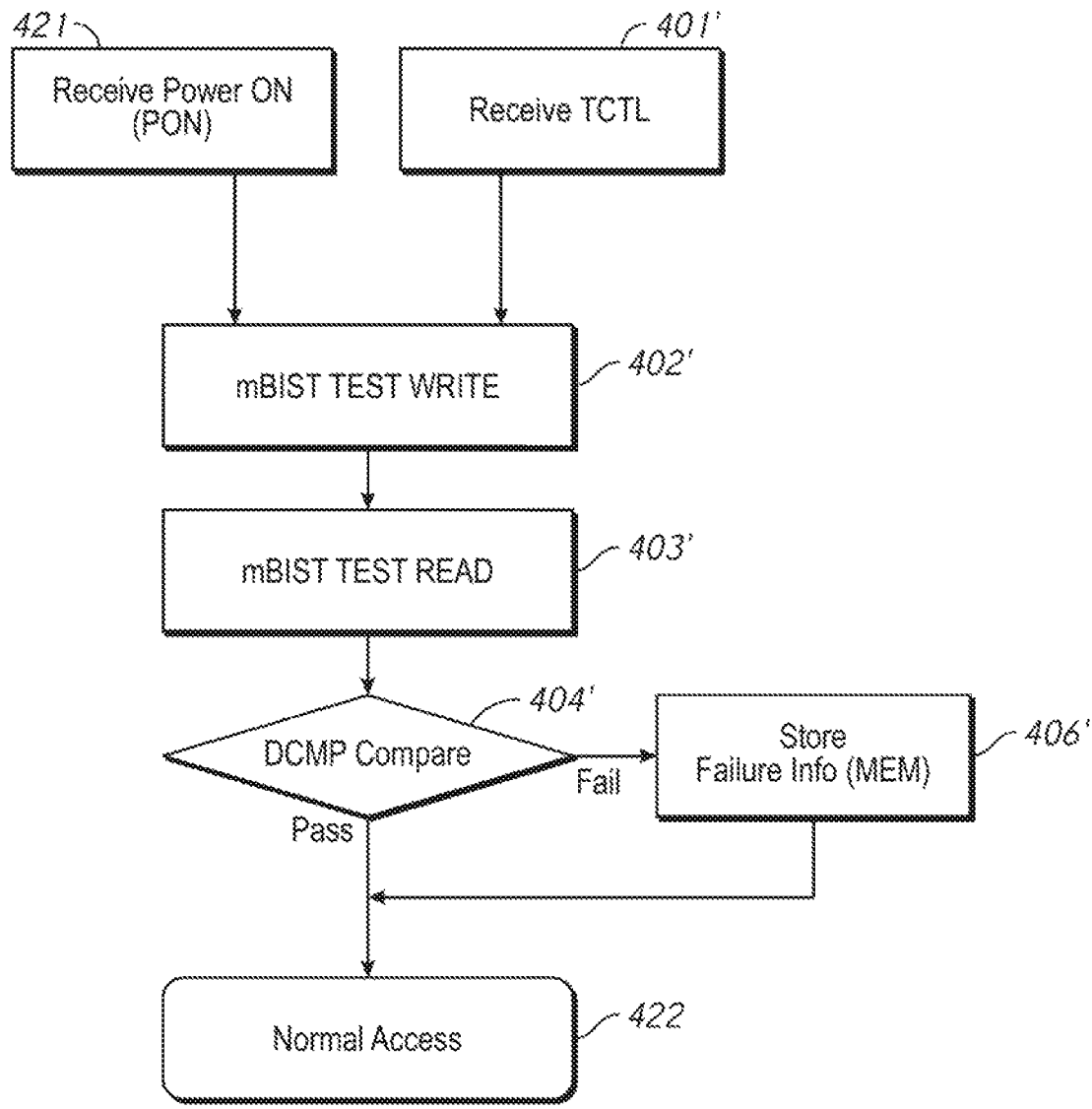
FIG. 4B is a simplified flow diagram of a test operation as a part of an initialization operation process performed by the mBIST in the semiconductor device in accordance with an embodiment of the present disclosure.

FIG. 4B is a simplified flow diagram of a test operation as a part of an initialization operation process performed by the mBIST in the semiconductor device in accordance with an embodiment of the present disclosure. The test operation as the part of the initialization operation process is similar to the test operation before shipping described above except a power on sequence. In an operation block 421, the mBISTL 411 may respond to a power on signal PON instead of the TCTL in order to initiate testing of the memory cells. In some embodiments, the TCTL may be used to initiate testing in an operational block 401' that is similar to the operation block 401 in FIG. 4A. In the test operation as the part of the initialization operation process, the programming of the determined defective address information into the defective address storing circuit of the core chips 22 may be skipped. Instead, the determined defective address information may be stored in the MEM 412 of the I/F chip 21 in an operation block 406', after executing the test write in an operation block 402', similar to the operation block 402, the test read in an operation block 403' similar to the operation block 403 and the comparison of the test read data and the expected data EXP[n:0] in an operation block 404' that is similar to the operation block 404. In an operation block 422, the normal access operation, including a write operation and a read operation, may follow the initialization operation.

3) Normal Write Operation

In the normal operation, the TEST may be inactive (e.g., at a logic low level). The DI/O[n:0] 35 may couple the TSVD[n:0] 33 to the DT[n:0] 37 until hit signals Hit_R/W become active (e.g., at a logic high level). The detailed description of the DI/O[n:0] 35 will be provided later referring to FIG. 5. An external memory controller (e.g., the memory controller 11 of FIG. 1B) may provide external data signals EXDATA[n:0] including write data to the DT[n:0] 37. The external memory controller may also provide an EXC/A[m:0] signal including a write command and access address information (e.g., write address information) to the AT[m:0] 38. The ASO[m:0] 36 may provide the EXC/A[m: 0] as the COREC/A[m:0] to the respective channel. In this embodiment, the ASO[m:0] 36 may further provide the EXC/A[m:0] on the BISTC/A node to the ACMP[m:0] 40. The ACMP[m:0] 40 may compare the access address information on the BISTC/A node with the detective address information DEFAIF[m:0] provided from the MEM 412. The ACMP[m:0] 40 may provide a comparison result ACMR[m:0] to a hit detection circuit HITD 49. When all ACMR[m:0] are indicative of a match between the access address information and the DEFAIF[m:0], the HITD 49 may provide a HIT signal to the mBISTL 411. In some embodiments, the MEM 412 may provide the DEFAIF[m:0] to the ACMP[m:0] 40. The ACMP[m:0] 40 may include latch circuits, for example, which may hold the DEFAIF[m:0] at least during the normal operation (e.g., the write operation or the read operation). The HIT signal may indicate that the provided address information corresponds to the defective address information. The HIT signal may also indicate a type of the operation (e.g., the write operation). In response to the HIT, the mBISTL 41 may provide a HIT_W signal to the DI/O[n:0] 35. Responsive to the HIT_W signal, the DI/O[n:0] 35 provides the EXDATA[n:0] on the BIST-DATA node to the MEM 412. The mBISTL 411 may perform the write operation on the MEM 412 to store the write date into the MEM. In some embodiments, the mBISTL 411 may stop performing a write operation on the respective channel on the core chip 22 while the repair operation, such as redirecting the access to the MEM 412, is being performed. When the address information on the BISTC/A node does not correspond to the DEFAIF[m:0], the DI/O[n:0] 35 may provide the EXDATA[n:0] to the channel as the COREDATA[n:0] and the COREDATA[n:0] are written into the corresponding memory cells of the core chip 22.

4) Normal Read Operation

The normal read operation is similar to the normal write operation described above except a reading sequence. In the read operation, the mBISTL 411 may provide the HIT_R signal in response to the HIT signal provided from the HITD 49 when any ACMR[m:0] is indicative of a match between the access address information (e.g., read address information) and the DEFAIF[m:0]. Responsive to the HIT_R signal, the DI/O[n:0] 35 may couple the DT[n:0] 37 to the MEM 412 through the BISTDATA node. The mBISTL may further perform the read operation on the MEM 412 to provide requested read data from the MEM 412. In some embodiments, the mBISTL 411 may control a read latency for the read data. The read data retrieved from the MEM 412 may be provided to the DI/O[n:0] 35 via the BISTDATA node. The DI/O[n:0] 35 may selectively couple the BIST-DATA node to the EXDATA node responsive to the active HIT_R signal, thus the DI/O[n:0] 35 may provide the read data to the DT[n:0] 37. In some embodiments, the mBISTL 411 may stop performing a read operation on the respective channel on the core chip 22 while the repair operation, such as redirecting the access to the MEM 412 for reading, is being performed. When the address information on the BISTC/A node does not correspond to the DEFAIF[m:0], the data may be retrieved from the memory cells of the respective channel of core chip 22 to the DT[n:0] 37.

Figure 5:
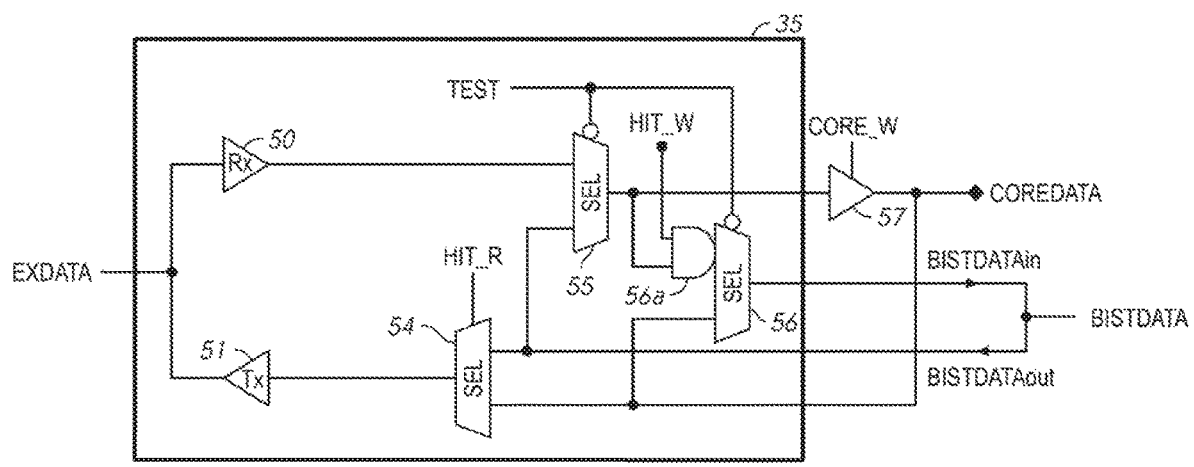
FIG. 5 is a schematic diagram of the data input/output circuit of FIG. 3, in accordance with an embodiment of the present disclosure.

FIG. 5 is a schematic diagram of the data input-output circuit (DI/O) 35 of FIG. 3, in accordance with an embodiment of the present disclosure. The DI/O 35 is coupled to the EXDATA node. The DI/O 35 may include a receiver buffer Rx 50. The receiver buffer Rx 50 receives the EXDATA from the DT 37 and may further provide the EXDATA to one input node of a selector 55. The selector 55 may further receive BISTDATAout on the BISTDATA node from the DCMP 39 at another input node. The selector 55 may further receive the TEST from the mBIST 41 at a select node after inversion. The TEST may be active in the test operation and inactive in the normal operation (e.g., a write operation, a read operation, etc.). If the TEST is inactive, the selector 55 may provide the EXDATA to a buffer circuit 57. If the TEST is active, the selector 55 may provide the BISTDATAout from the BISTDATA node to the buffer circuit 57. For example, the buffer circuit 57 may be a tri-state buffer. An input node of the buffer circuit 57 may receive a signal from the selector 55. An enable input node of the butter circuit 57 may receive a write enable signal CORE_W, indicative of enabling writing data to the core chips 22. For example, the CORE_W may be provided as a portion of the COREC/A by the ASO 36 in response to a write command. The buffer circuit 57 may provide the signal from the selector 55 as the COREDATA when the CORE_W is active (e.g., a logic high level). The DI/O 35 may include a selector 56 and a NAND circuit 56a coupled to one input node of the selector 56. The NAND circuit 56a may receive a HIT_W signal and the signal from the selector 55. The NAND circuit 56a may provide the signal from the selector 55 to the one input node of the selector 56 responsive to the active HIT_W signal. The selector 56 may have another input node that may receive the output signal of the buffer circuit 57 provided as the COREDATA. The selector 56 may further receive the TEST from the mBIST 41 at a select node after inversion. When the TEST is active, the selector 56 may provide the signals in parallel from the selector 55 via the buffer circuit 57, the same data as the COREDATA as BISTDATAin through the BISTDATA node to the DCMP 39. When HIT_W is active while the TEST is inactive, the selector 56 may provide the EXDATA as the BISTDATAin through the BISTDATA node to the DCMP 39. In the normal write operation without defective address information, the TEST and the HIT_W both are inactive. Thus, no data may be provided from the selector 45. Thus, merely the EXDATA may be provided as the COREDATA through the selector 55 and the buffer circuit 57.

A selector 54 may receive the BISTDATAout and the COREDATA. The selector 54 may further receive the HIT_R at a select node from the mBIST 41. The selector 55 may provide the BISTDATAout if the HIT_R is active. The selector 54 may further provide the COREDATA if the HIT_R is inactive. A transmitter buffer 51 may provide the output signal in series as the EXDATA.

Figure 6:
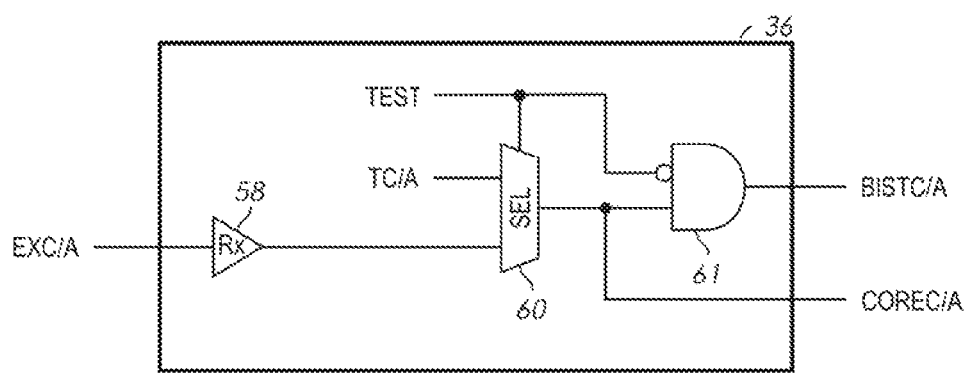
FIG. 6 is a schematic diagram of the access signal output circuit of FIG. 3, in accordance with an embodiment of the present disclosure.

FIG. 6 is a schematic diagram of the access signal output circuit (ASO) 36 of FIG. 3, in accordance with an embodiment of the present disclosure. The ASO 36 may include a receiver buffer Rx 58. The receiver buffer Rx 58 receives the EXC/A from the AT 38. The selector 60 may further receive the TO A from the mBIST 41 at another input node. The selector 60 may further receive the TEST from the mBIST 41 at a select node. The TEST may be active in the test operation and inactive in the normal operation. If the TEST is inactive, the selector 60 may provide the EXC/A as the COREC/A. If the TEST is active, the selector 60 may provide the TC/A as the COREC/A. An AND circuit 61 may receive output signals of the selector 60. The AND circuit 61 may further receive the TEST from the mBIST 41 after inversion. The TEST after the inversion become inactive responsive to the active TEST, and the BISTC/A node becomes inactive. The AND circuit 61 may provide the EXC/A received from the selector 60 responsive to the inactive TEST to the BISTC/A.

Figure 7A:
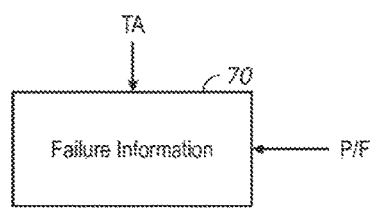
FIG. 7A is a schematic diagram of a portion of the MEM of FIG. 3, in accordance with an embodiment of the present disclosure.
Figure 7B:
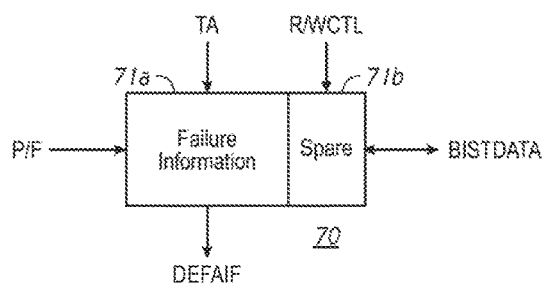
FIG. 7B is a schematic diagram of a portion of the MEM of FIG. 3, in accordance with an embodiment of the present disclosure.

FIGS. 7A and 7B are schematic diagrams of a portion of the storage area MEM 412 of FIG. 3, in accordance with an embodiment of the present disclosure. For example, the MEM 412 may include error catch memories (ECMs) 70. In the test operation, the ECMs 70 may receive test address information TA included in the MEMCTL and the fail signal P/F. The ECMs 70 may store the TA as failure information including defective address information, responsive to the active fail signal P/F. In the normal operation, the ECMs 70 may have a plurality of portions, including a portion 71a and a portion 71b. The portion 71a of the plurality of portions of ECMs 70 may store the failure information. The failure information may be detected and stored during the initialization operation, as earlier described. The defective address information DEFAIF may be provided from the portion 71a to a corresponding ACMP 40. The portion 71b of the plurality of portions of ECMs 70 may include spare memory cells mat may replace defective memory cells of the core chips 22 addressed by the failure information. The portion 71b of the plurality of portions of ECMs 70 may receive a control signal R/WCTL in the MEMCTL indicative of the read operation or the write operation. The portion 71b may include one or more spare memory cells that may store data from the BISTDATA node responsive to the TA and the R/WCTL indicative of the write operation, in the write operation. The portion 71b may provide data from the one or more spare memory cells to the BISTDATA node responsive to the TA and the R/WCLTL indicative of the read operation, in the read operation.

Figure 7C:
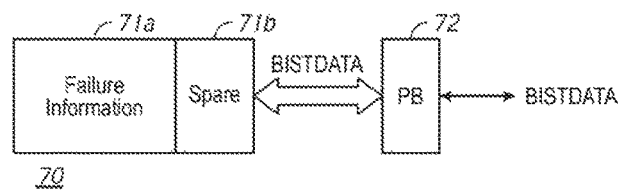
FIG. 7C is a schematic diagram of a portion of the MEM of FIG. 3, in accordance with an embodiment of the present disclosure.

FIG. 7C is a schematic diagram of a portion of the MEM of FIG. 3, in accordance with an embodiment of the present disclosure. In this embodiment, the ECMs 70 may further include a page buffer PB 72, which may buffer data between the spare memory cells in the portion 71b and the DI/O 35. The PB 72 may include a plurality of flip-flops, for example, which may provide access speed higher than access speed of the ECMs 70.

Figure 7D:
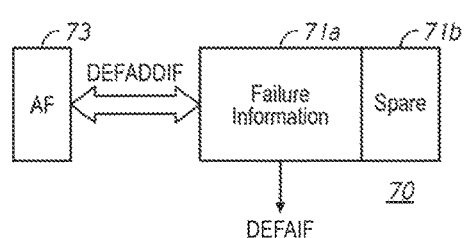
FIG. 7D is a schematic diagram of a portion of the MEM of FIG. 3, in accordance with an embodiment of the present disclosure.

FIG. 7D is a schematic diagram of a portion of the MEM of FIG. 3, in accordance with an embodiment of the present disclosure. In this embodiment, the ECMs 70 may further include anti-fuses AF 73 to permanently store the failure information.

Figure 8:
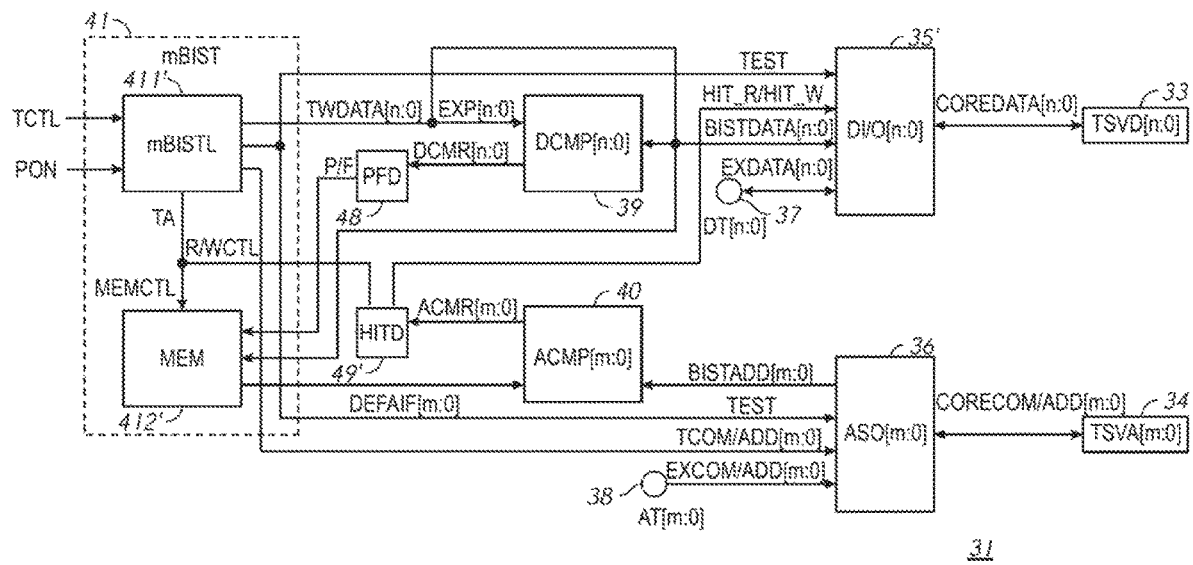
FIG. 8 is a block diagram of the I/F chip including a memory Built-In Self Test (mBIST) circuit in the semiconductor device in accordance with an embodiment of the present disclosure.

FIG. 8 is a block diagram of the I/F chip 31 including a memory Built-In Self Test (mBIST) circuit 41 in the semiconductor device in accordance with an embodiment of the present disclosure. Description of components corresponding to components included in and previously described with reference to FIG. 3 will not be repeated. Unlike the I/F chip of FIG. 3, the HITD 49' may control read and write operations on the MEM 412" instead of the mBISTL 411'. The HITD 49' may provide a portion of the MEMCTL signals, such as the TA and the R/WCTL to the MEM 412', when all ACMR[m:0] are indicative of a match between the access address information (e.g., read address information) and the DEFAIF[m:0]. In this example, the HITD 49' may directly provide the HIT_R and the HIT_W to the DI/O[n:0] 35' instead of providing the HIT to the mBISTL 411' and having the mBISTL 411' providing the HIT_R and the HIT_W.

Figure 9:
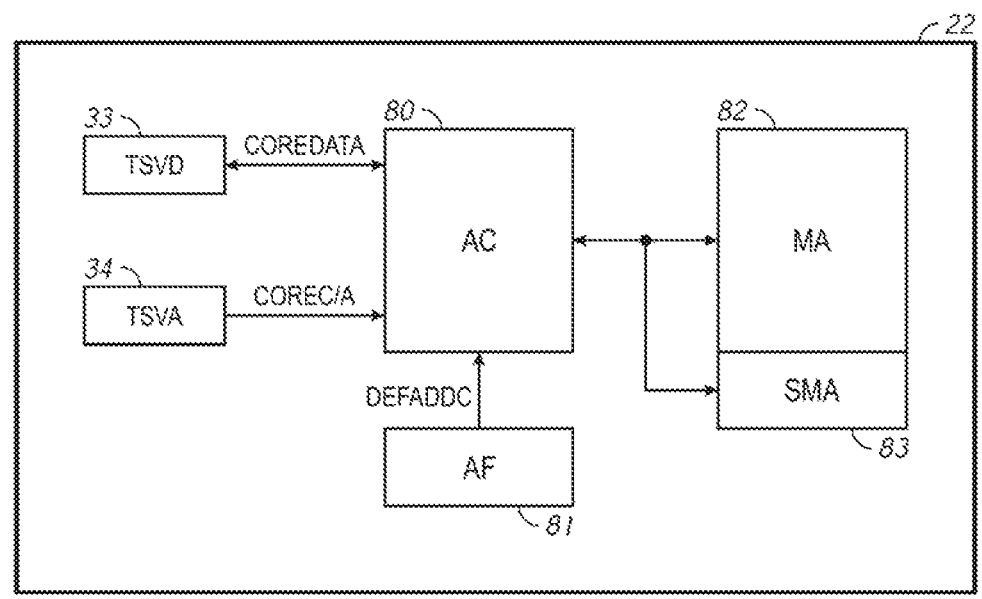
FIG. 9 is a schematic diagram of one core chip of the plurality of core chips in the semiconductor device in accordance with an embodiment of the present disclosure.

FIG. 9 is a schematic diagram of one core chip of the plurality of core chips 22 in the semiconductor device in accordance with an embodiment of the present disclosure. The one core chip may include an access control circuit AC 80, a memory cell array MA 82, a spare memory cell array SMA 83 and a defective address storing circuit AF 81. For example, the detective address storing circuit AF 81 may include anti fuses. In some embodiments, memory cells in the MA 82 and memory cells in the SMA 83 may be different in type from the memory cells in the MEM 412 of the I/F chip 21. For example, the memory cells in the MA 82 and the memory cells in the SMA 83 may be DRAM memory cells. The SMA may include a plurality of spare memory cells to replace the defective memory cells in the memory cell array as described earlier. The AF 81 may store failure information, including defective address information. As described above, the MEM 412 of the I/F chip 21 may also store defective address information. The defective address information stored in the MEM 412 of the I/F chip 21 and the defective address information stored in the AF 81 of each core chip 22 may be different from each other. In some embodiments, the defective address information detected during a test operation may be stored into the AF 81 of each core chip 22 while the defective address information detected during an initialization operation may be stored into the MEM 412 of the I/F chip 21. In some embodiments, the AF 81 may store the detective address information for memory cells in the MA 82 on the same core chip 22, while the MEM 412 of the I/F chip 21 may store the defective address information for cells placed in any core chip 22 in the semiconductor device. The AC 80 may perform read and write operations on the MA 82 in response to the COREC/A via the TSVA 34 and the COREDATA via the TSVD 33. The AC 80 may access memory cells in SMA 83 when the COREC/A includes the access address information that corresponds with one or more addresses included of the defective address information in DEFADDC provided from the AF 81.

Figure 10:
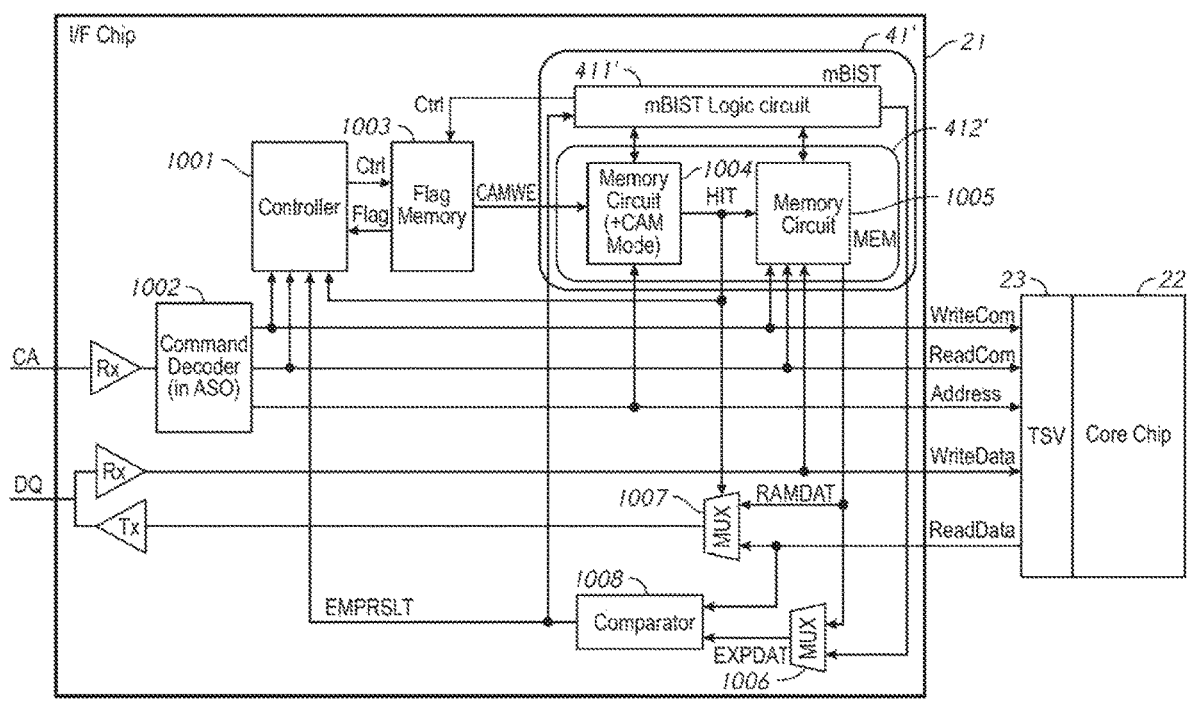
FIG. 10 is a block diagram of the I/F chip including a memory Built-In Self Test (mBIST) circuit in the semiconductor device in accordance with an embodiment of the present disclosure.

FIG. 10 is a block diagram of the LF chip including a memory Built-In Self Test (mBIST) circuit in the semiconductor device in accordance with an embodiment of the present disclosure. The I/F chip 21 may include a command decoder 1002, which may be included in the access signal output circuit ASO 36 in FIG. 3. The command decoder 1002 may receive command/address signals CA via an input buffer Rx, and may further provide write command information (WriteCom), read command information (ReadCom) and an address to one or more core chips 22 through a signal line 23 implemented as a through substrate via (TSV) (e.g., TSVA 34 in FIG. 1B). The I/F chip 21 may include a controller circuit 1001 and an mBIST circuit 41' which includes an mBIST logic circuit 411' and a storage area MEM 412'. The MEM 412' may include a plurality of memory circuits 1004 and 1005. For example, the plurality of memory circuits 1004 and 1005 may be static random access memories (SRAMs) and one memory circuit 1004 of the plurality of memory circuits 1004 and 1005 may include a CAM memory that may function in a contents-addressable-memory (CAM) mode. The controller circuit 1001 may control the memory circuit 1004 through a flag memory 1003. The controller circuit 1001 may receive the WriteCom and the ReadCom. The controller circuit 1001 may also receive HIT signal from a storage area MEM 412'. The controller circuit 1001 may also receive flag information from a flag memory 1003. For example, the flag information may include in-use flag information and locked flag information. The in-use flag information may indicate that an area with the CAM mode corresponding to a particular address provided in the memory circuit 1004 is already in use. The locked flag information may indicate that an area in the CAM mode corresponding to a particular address provided in the memory circuit 1004 is locked and unmodifiable (e.g. already storing the defective address information). The memory circuit 1005 may provide data stored on the memory circuit 1005 on a RAMDAT node (e.g., the BIST-DATA node in FIG. 3). A multiplexer MUX 1006 and a multiplexer MUX 1007, which may function as the DI/O [n:0] 35 in FIG. 3, receive the data from the RAMDAT node.

The MUX 1007 may receive data read from the core chip 22 via a TSV 23 (e.g., TSVD 33 in FIG. 1B) via a ReadData node. The MUX 1007 provides an output signal to a data queue DQ node via an output buffer Tx, responsive to the HIT signal from the memory circuit 1004. If the HIT signal is active (e.g., a logic high level) indicative that the RAMDAT is to be provided, the MUX 1007 may provide the data from the RAMDAT node. The MUX 1007 may provide the read out data from the core chip 22 via the ReadData node if the HIT signal is inactive (e.g., a logic low level) and no replacement data is stored in the MEM 412' for the particular address. The MUX 1006 receives the data from the RAMDAT node as well as test data from the mBIST logic circuit 411' and provides either the data from the RAMDAT node or the test data as expected data on an EXPDAT (e.g., the EXP in FIG. 3) node to a comparator 1008, responsive to whether the data is to be matched with the data from the MEM 412' or the test data from the mBIST logic circuit 411" (e.g., the test write data TWDATA in FIG. 3). The comparator 1008 (e.g., the DCMP 39 in FIG. 3) compares the expected data the EXPDAT node and the ReadData and provides comparison result signal CMPRSLT (e.g., the P/F in FIG. 3) to the controller circuit 1001 and the mBIST logic circuit 411'. Either the controller circuit 1001 or the mBIST logic circuit 411' may send control signals (Ctrl) to set the in-use flag information and the locked flag information in the flag memory 1003.

In write operations, the controller circuit 1001 may write an address provided along with the WriteCom into the memory circuit 1004 in response to the WriteCom, the in-use flag information, the locked flag information and the HIT signal. For example, the memory circuit 1004 may store the address in the CAM memory and may further provide an inactive HIT signal to the memory circuit 1005 and the controller circuit 1001 if the address is not stored in the CAM memory in the memory circuit 1004. The memory circuit 1004 may provide an active HIT signal to the memory circuit 1005 and the controller circuit 1001, if the address is already stored in the CAM memory in the memory circuit 1004. The memory circuit 1005 may store data provided from the data queue DQ node via an input buffer Rx on a WriteData node, responsive to the HIT signal. For example, the memory circuit 1005 may store data on the WriteData node in an area addressed by a newly allocated address, if the HIT signal is inactive. The memory circuit 1005 may store the data on the WriteData node in an area already allocated corresponding to the address, if the HIT signal is active. Data on the WriteData node may be also provided to respective memory cells of the core chip 22. In some embodiments, data on the WriteData node may not be provided to the respective memory cells of the core chip 22 if the corresponding address have been held and locked in the CAM memory. The controller circuit 1001 may prevent writing the address if the in-use flag information or the locked flag information for all addresses in the memory circuit 1004 may indicate that all of the CAM memory in the memory circuit 1004 is already in-use or locked and thus unavailable.

Figure 11A:
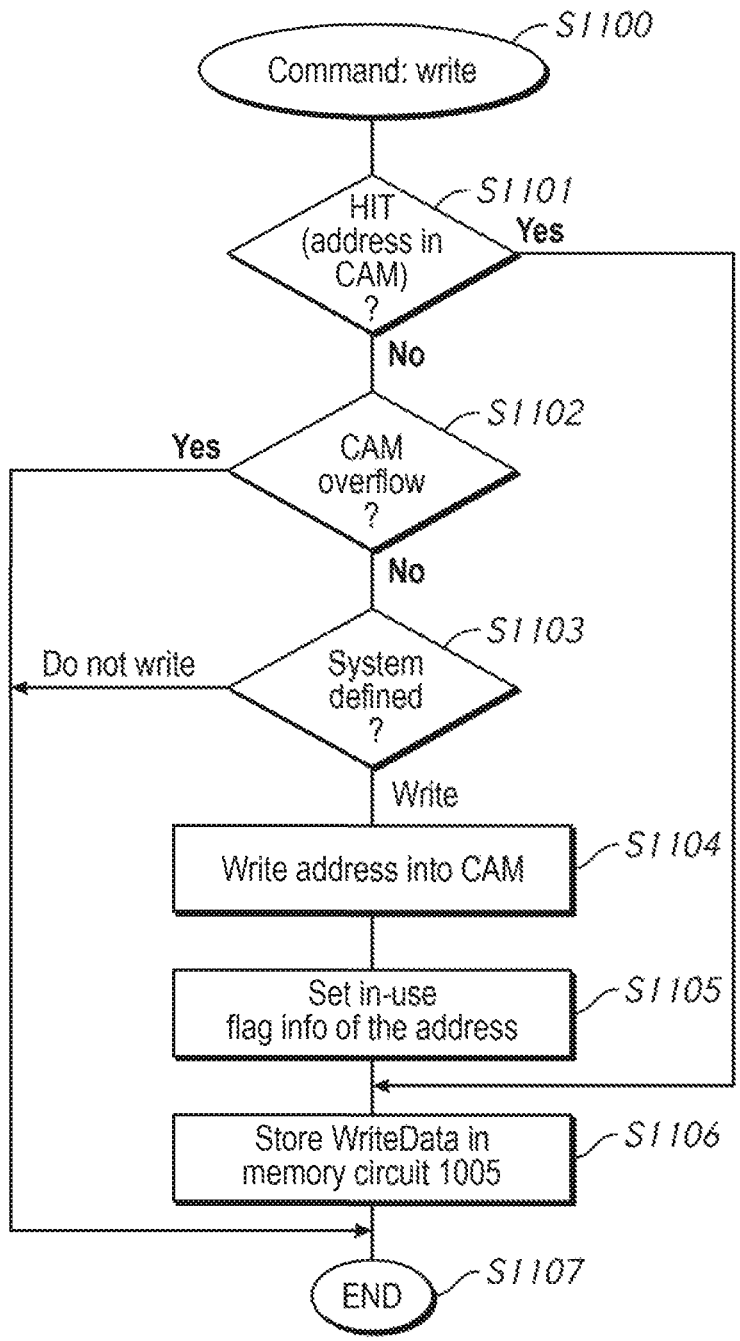
FIG. 11A is a simplified flow diagram of a write operation in the I/F chip of FIG. 10, in accordance with an embodiment of the present disclosure.

FIG. 11A is a simplified flow diagram of a write operation in the I/F chip of FIG. 10, in accordance with an embodiment of the present disclosure. Upon receiving a write command at the command decoder 1002 (S1100), the controller circuit 1001 may provide the address along with the WriteCom to the flag memory 1003 and the flag memory 1003 may provide the address to the memory circuit 1004 on a CAMWE signal. The memory circuit 1004 may determine whether the address is already stored in the CAM memory and may further provide the HIT signal to the controller circuit 1001 and the memory circuit 1005. The memory circuit 1005 may check whether the HIT signal is active (S1101) and may further store the data on the WriteData node if the HIT signal is active (S1106). If the HIT signal is not active "N", the controller circuit 1001 may check the in-use flag information and the locked flag information (S1102). If the in-use flag information and the locked flag information are indicative that all the CAM memory is used (CAM overflow), the controller circuit 1001 may skip writing the address in the CAM memory in the memory circuit 1004 and may end the writing operation (S1107).

Optionally, the controller circuit 1001 may skip writing the address in the CAM memory in the memory circuit if the address is related to system defined conditions (S1103). For example, the system defined conditions may include an address sampling. The address sampling condition may include random sampling, the addresses which tend to be accessed frequently, the addresses in a same area (e.g., the same core, the same channel, etc.) having a frequent repair history and thus a higher deficiency rate than other area, or the addresses in a predetermined range due to system configuration (e.g., having a small margin). Alternatively, it is possible to have an additional counter having a count of the additional counter may be changed at a predetermined interval to point a next address in the core dies to be stored for checking the deficiency. Alternatively, it is possible to write the address to overwrite an oldest address stored in the CAM memory (after skipping the step S1102). Depending on the steps S1102 and S1103, the controller circuit 1001 may write the address to the CAM memory (S1105) and set in-use flag information of the address. The memory circuit 1005 stores the data on the WriteData node along with the address and the WriteCom (S1106) if the HIT signal is active or if the controller circuit 1001 writes the address to the CAM memory and the write operation is completed (S1107).

In read operations, the memory circuit 1004 may compare the address provided along with the ReadCom with addresses stored in the CAM memory. The memory circuit 1004 may provide the active HIT signal to the memory circuit 1005 if the address is found in the addresses in the CAM memory. The multiplexer MUX 1007 may provide either the data on the RAMDAT node or ReadData from the core chip 22 via the TSV 23 to the data queue DQ via an output buffer Tx, responsive to the active HIT signal. As described earlier, the comparator 1008 may compare the ReadData with the data on the RAMDAT node and may further provide the CMPRSLT signal. The controller 1001 may control the flag memory 1003 to change the in-use flag information of the address inactive (e.g., "0"), if the CMPRSLT signal indicates that the data on the RAMDAT node match the ReadData. Thus, the CAM memory which has stored the address is freed and becomes available to store a new address. If the CMPRSLT signal indicates that the data on the RAMDAT node do not match the ReadData, locked flag information of the address active (e.g., "1") to prevent the CAM memory of the address from overwriting a new address. As a result, the CAM memory may store the address as the defect address information and the read write operation of the address in the core chip 22 may be redirected permanently to the memory circuit 1005 in the MEM 412'.

Figure 11B:
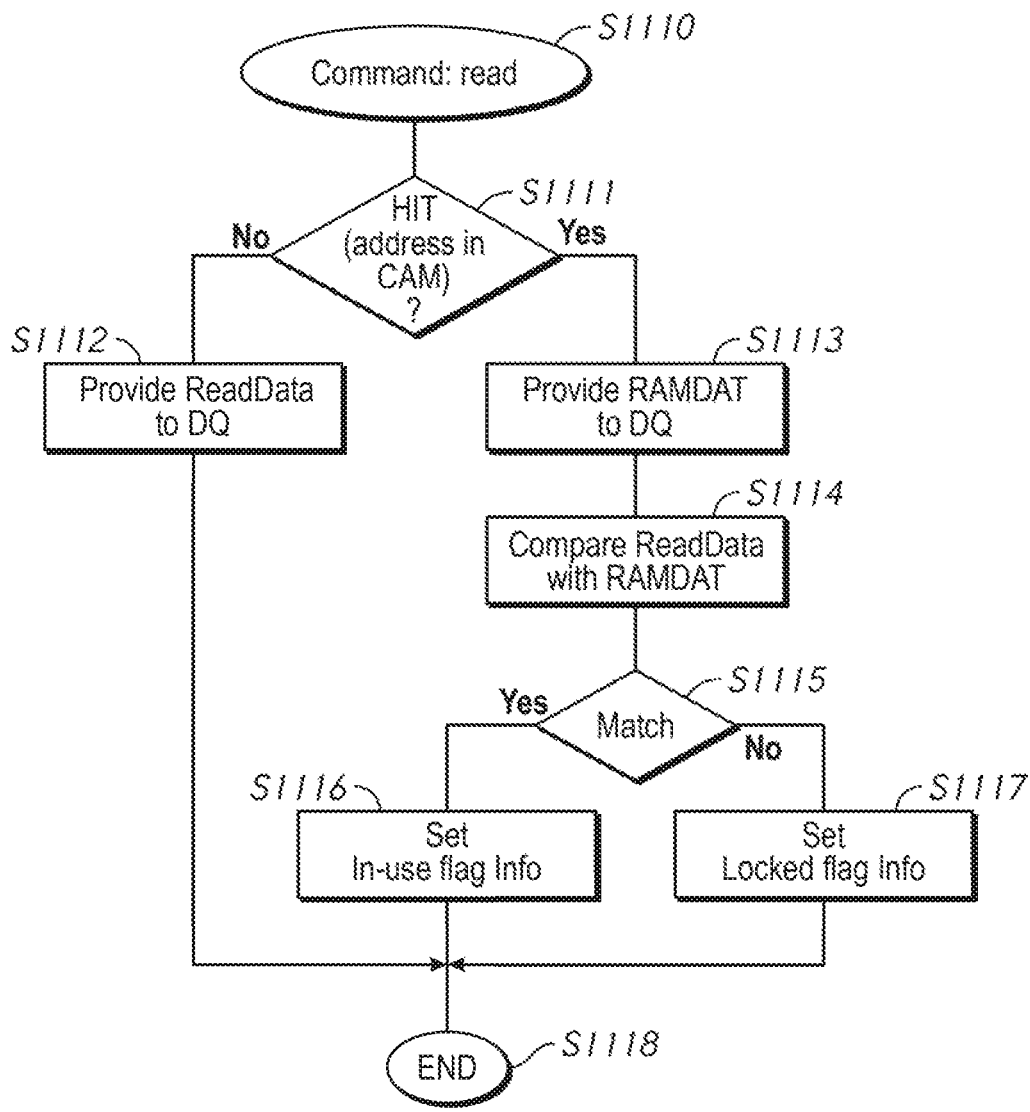
FIG. 11B is a simplified flow diagram of a read operation in the I/F chip of FIG. 10, in accordance with an embodiment of the present disclosure.

FIG. 11B is a simplified flow diagram of a read operation in the I/F chip of FIG. 10, in accordance with an embodiment of the present disclosure. Upon receiving a read command at the command decoder 1002 (S1100), the controller circuit 1001 may provide the address along with the ReadCom to the flag memory 1003 and the flag memory 1003 may provide the address to the memory circuit 1004 on a CAMWE signal. The memory circuit 1004 may determine whether the address is already stored in the CAM memory and may further provide the HIT signal to the controller circuit 1001, the memory circuit 1005 and the multiplexer MUX 1007. The MUX 1007 may check whether the HIT signal is active (S1111) and may further provide the ReadData from the core chip 22 via the TSV 23, if the HIT signal is inactive "N" (S1112) and the write operation is completed (S1118). If the HIT signal is active "Y", the MUX 1007 may provide the data on the RAMDAT node to the data queue DQ (S1113). The comparator 1008 may compare the ReadData with the data on the RAMDAT node with and may further provide the CMPRSLT signal (S1116). The controller 1001 may control the flag memory 1003 to change the in-use flag information of the address inactive (e.g., "0"), if the CMPRSLT signal indicates that the data on the RAMDAT node match the ReadData (S1116) and the read operation is completed (S1118). Thus, the CAM memory which has stored the address is freed and becomes available to store a new address. If the CMPRSLT signal indicates that the data on the RAMDAT node do not match the ReadData, the flag memory 1003 may set locked flag information of the address active (e.g., "1") to prevent the CAM memory of the address from overwriting a new address (S1117) and the read operation is completed (S1118).

Figure 12:
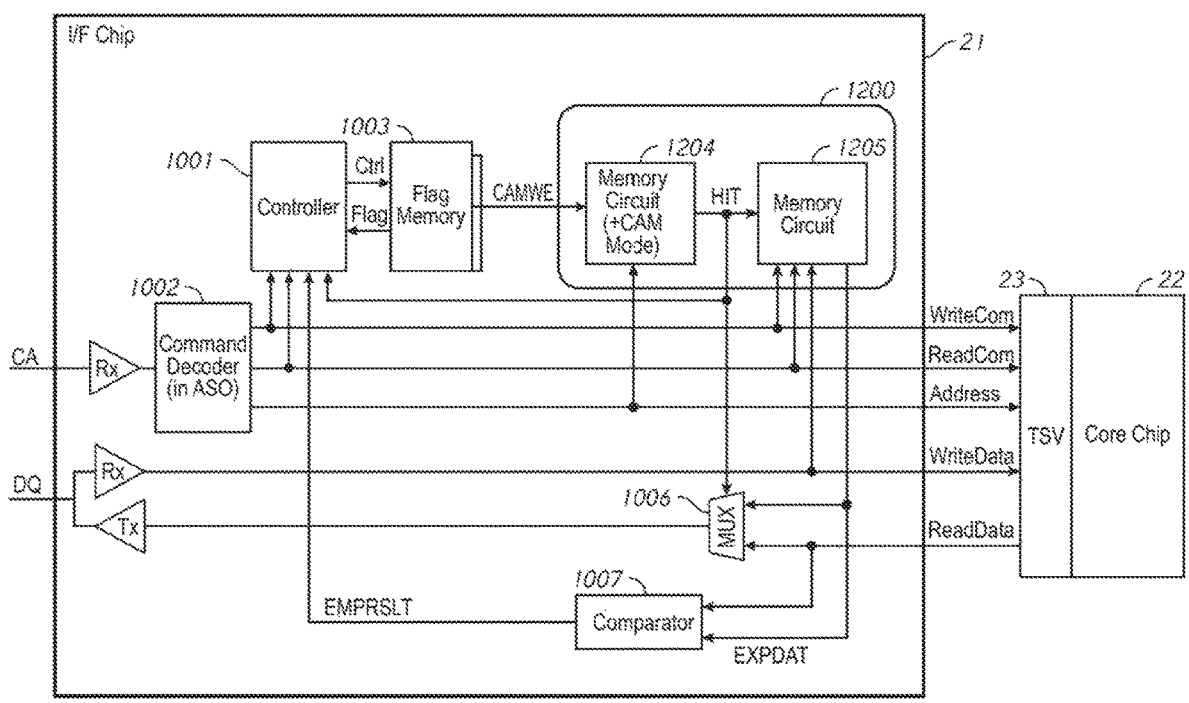
FIG. 12 is a block diagram of the I/F chip in the semiconductor device in accordance with an embodiment of the present disclosure.

FIG. 12 is a block diagram of the I/F chip in the semiconductor device in accordance with an embodiment of the present disclosure. Description of components corresponding to components included in and previously described with reference to FIG. 10 will not be repeated. The I/F chip 21 may include a storage area MEM 1200 including a plurality of memory circuits 1204 and 1205. For example, the plurality of memory circuits 1204 and 1205 may be static random access memories (SRAMs) and one memory circuit 1204 of the plurality of memory circuits 1204 and 1205 may include a CAM memory that may function in a contents-addressable-memory (CAM) mode. The controller circuit 1001 may control the memory circuit 1204 through a flag memory 1003. The controller circuit 1001 may receive a WriteCom and a ReadCom. The controller circuit 1001 may also receive HIT signal from a storage area MEM 1200. The controller circuit 1001 may also receive flag information from a flag memory 1003. For example, the flag information may include in-use flag information and locked flag information. The in-use flag information may indicate that an area with the CAM mode corresponding to a particular address provided in the memory circuit 1204 is already in use. The locked flag information may indicate that an area in the CAM mode corresponding to a particular address provided in the memory circuit 1204 is locked and unmodifiable (e.g., already storing the defective address information). The memory circuit 1205 may provide data stored on the memory circuit 1205 on a RAM DAT node (e.g., the BISTDATA node in FIG. 3). A multiplexer MUX 1006 and a multiplexer MUX 1007, which may function as the DI/O [n:0] 35 in FIG. 3, receive the data from the RAMDAT node. The MUX 1007 may receive data read from the core chip 22 via a TSV 23 (e.g., TSVD 33 in FIG. 1B) via a ReadData node. The MUX 1007 provides an output signal to a data queue DQ node via an output buffer Tx, responsive to the HIT signal from the memory circuit 1204. If the HIT signal is active (e.g., a logic high level) indicative that data on the RAMDAT node is to be provided, the MUX 1007 may provide the data from the RAMDAT node. The MUX 1007 may provide the read out data from the core chip 22 via the ReadData node if the HIT signal is inactive (e.g., a logic low level) and no replacement data is stored in the memory circuit 1205 for the particular address. The MUX 1006 receives the data from the RAMDAT node as well as test data from the memory circuit 1205 and provides either the data from the RAMDAT node or the test data as expected data on an EXPDAT (e.g., the EXP in FIG. 3) node to a comparator 1008, responsive to whether the data is to be matched with the test data from the memory circuit 1205. The comparator 1008 (e.g., the DCMP 39 in FIG. 3) compares the expected data the EXPDAT node and data read from the core chip 22 on the ReadData node and provides comparison result signal CMPRSLT (e.g., the P/F in FIG. 3) to the controller circuit 1001. The controller circuit 1001 may send control signals (Ctrl) to set the in-use flag information and the locked flag information in the flag memory 1003.

Figure 13:
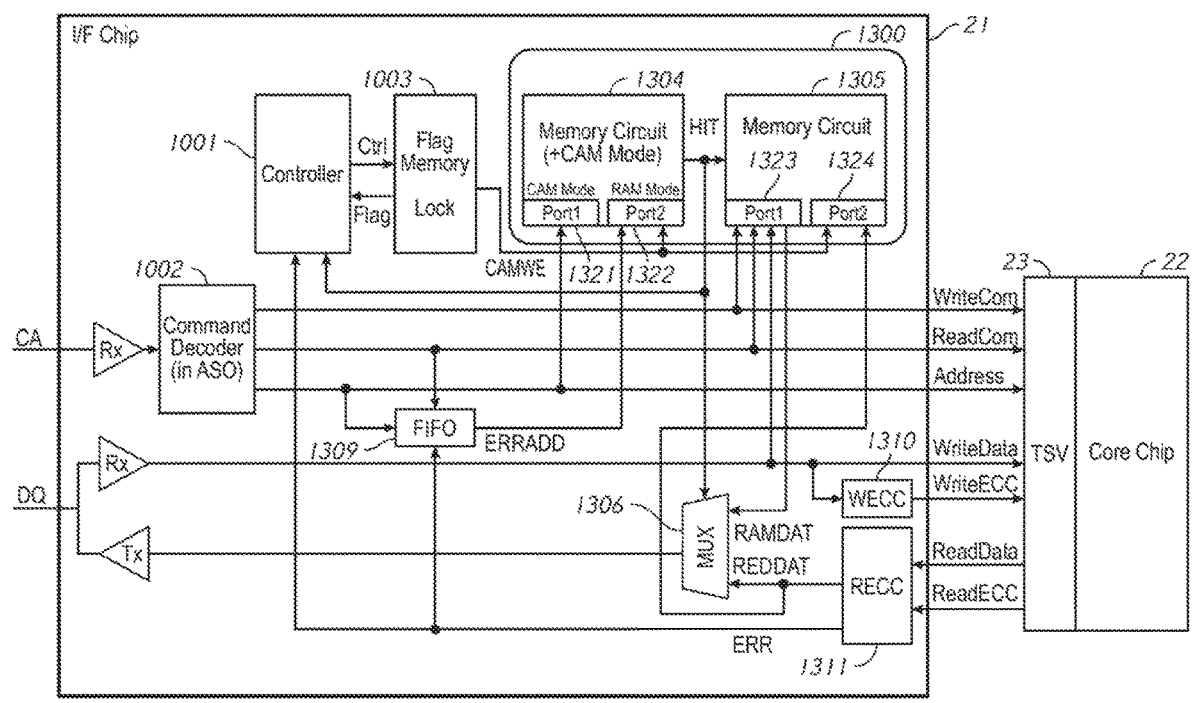
FIG. 13 is a block diagram of the I/F chip in the semiconductor device in accordance with an embodiment of the present disclosure.

An I/F chip may include an error correction code (ECC) function. FIG. 13 is a block diagram of the I/F chip in the semiconductor device in accordance with an embodiment of the present disclosure. Description of components corresponding to components included in and previously described with reference to FIG. 10 will not be repeated. The I/F chip 21 may include a storage area MEM 1300 including a plurality of memory circuits 1304 and 1305. For example, the plurality of memory circuits 1304 and 1305 may be static random access memories (SRAMs) and one memory circuit 1304 of the plurality of memory circuits 1304 and 1305 may include a CAM memory that may function in a contents-addressable-memory (CAM) mode. The memory circuit 1304 may include two ports Port1 1321 and Port2 1322. The port Port1 1321 may receive an address from a command decoder 1002 for accessing the CAM memory. The port Port2 1322 may receive a control signal CAMWE and an error address signal ERRADD. The memory circuit 1305 may include two ports Port1 1323 and Port2 1324. The port Port1 1323 may receive a WriteCom from the command decoder 1002 and may further receive data on a WriteData node from a data queue DQ node in a write operation. The port Port1 132 may receive a ReadCom from the command decoder 1002. The port Port2 1322 may receive the control signal CAMWE and a read data signal REDDAT. The controller circuit 1001 may provide a control signal Ctrl to control the memory circuit 1304 through a flag memory 1003. The flag memory 1003 may provide the control signal CAMWE to the port Port2 1322 of the memory circuit 1304 and the plurality of memory circuit 1304 and 1305. The controller circuit 1001 may receive HIT signal from the storage area MEM 1300. The controller circuit 1001 may also receive flag information from the flag memory 1003. For example, the flag information may include in-use flag information and locked flag information. The in-use flag information may indicate that an area with the CAM mode corresponding to a particular address provided in the memory circuit 1304 is already in use. The locked flag information may indicate that an area in the CAM mode corresponding to a particular address provided in the memory circuit 1304 is locked and unmodifiable (e.g., already storing the defective address information). The memory circuit 1305 may provide data stored on the memory circuit 1305 on a RAMDAT node (e.g., the BIST-DATA node in FIG. 3) through the port Port1 1323. A multiplexer MUX 1306, which may function as the DI/O [n:0] 35 in FIG. 3, receive the data from the RAMDAT node.

The I/F die 21 may include a write error correction circuit (WECC) 1310 which may generate a Write error correction code (WriteECC) based on data on the WriteData node during a write operation and provide the ECC on a WriteECC node to the cote chip 22 with the data on the WriteData node. The I/F die 21 may include read error correction circuit (RECC) 1311 that may receive the data on the ReadData node and a Read error correction code (ReadECC) from the core chip 22 via a TSV 23 (e.g., TSVD 33 in FIG. 1B), check if there is an error based on the ReadECC and the data read from the core chip 22 on the ReadData node, and may further correct the error, if any, during read operations. The RECC 1311 circuit may activate an ERR signal if there is the error, regardless of whether error is correctable or uncorrectable.

The MUX 1306 may receive data REDD AT which is a data signal from the RECC 1311 and the data on the RAMDAT node. The MUX 1306 provides an output signal to the data queue DQ node via an output buffer Tx, responsive to the HIT signal from the memory circuit 1304. If the HIT signal is active (e.g., a logic high level) indicative that data on the RAMDAT node is to be provided, the MUX 1306 may provide the data from the RAMDAT node. The MUX 1306 may provide the read out data REDDAT which may be after the error correction at the RECC 1311, if the HIT signal is inactive (e.g., a logic low level) and no replacement data is stored in the memory circuit 1305 for the particular address. The I/F die 21 may also include a first-in-first-out memory (FIFO) 1309 which may receive the address and store the address during read operations responsive to the ReadCom. The FIFO 1309 provides the address on an ERRADD node to the port Port2 1322 of the memory circuit 1304 responsive to the ERR signal.

Figures 14A, 14B:
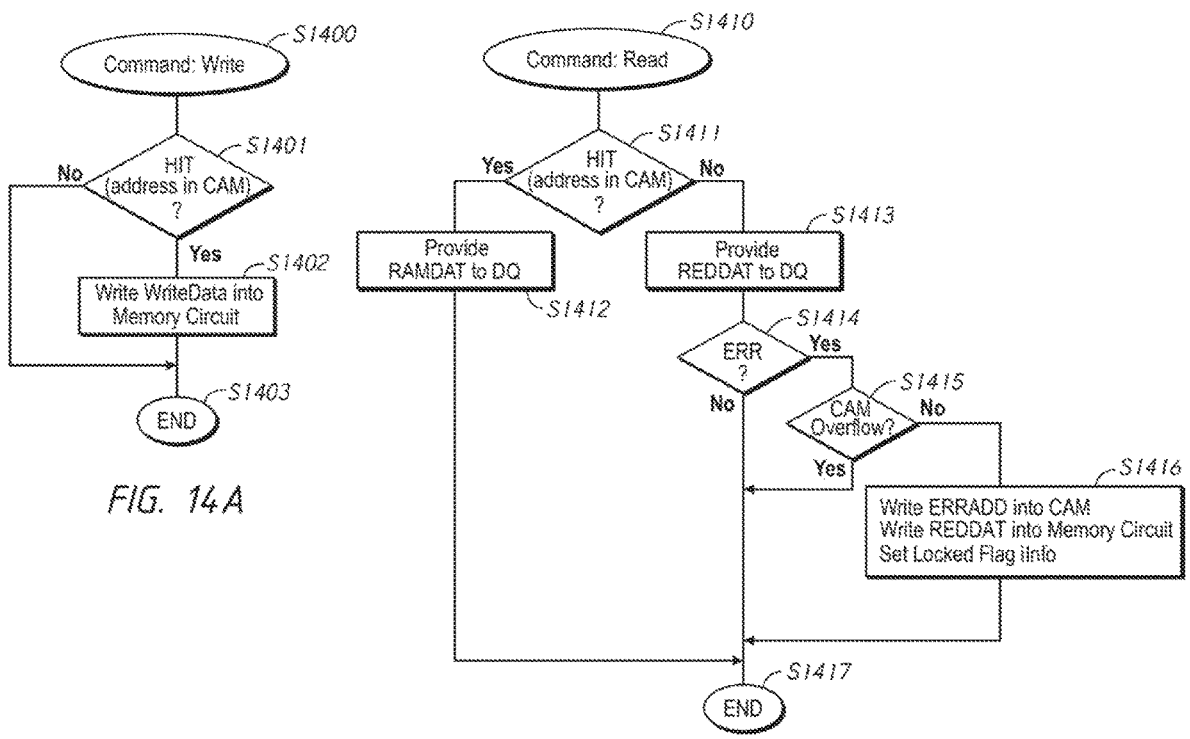
FIG. 14A is a simplified flow diagram of a write operation in the I/F chip of FIG. 13, in accordance with an embodiment of the present disclosure.
FIG. 14B is a simplified flow diagram of a read operation in the I/F chip of FIG. 13, in accordance with an embodiment of the present disclosure.

FIG. 14A is a simplified flow diagram of a write operation in the I/F chip of FIG. 13, in accordance with an embodiment of the present disclosure. Upon receiving a write command at the command decoder 1002 (S1400), the controller circuit 1001 may provide the address along with the WriteCom to the flag memory 1003 and the flag memory 1003 may provide the address to the plurality of the memory circuits 1304 on the CAMWE signal. The memory circuit 1304 may determine whether the address is already stored in the CAM memory and may further provide the HIT signal to the controller circuit 1001, the memory circuit 1305. The memory circuit 1305 may check whether the HIT signal is active (S1401) and may further store the data on the WriteData node if the HIT signal is active (S1402) and end the writing operation (S1403). If the HIT signal is not active "N", the controller circuit 1001 may skip writing the data and end the writing operation (S1403).

FIG. 14B is a simplified flow diagram of a read operation in the I/F chip of FIG. 13, in accordance with an embodiment of the present disclosure. Upon receiving a read command at the command decoder 1002 (S1410), the controller circuit 1001 may provide the address along with the ReadCom to the flag memory 1003 and the flag memory 1003 may provide the address to the memory circuit 1304 on the CAMWE signal. The memory circuit 1304 may determine whether the address is already stored in the CAM memory and may further provide the HIT signal to the controller circuit 1001, the memory circuit 1005 and the multiplexer MUX 1306. The MUX 1306 may check whether the HIT signal is active (S1411). If the HIT signal is active "Y", the MUX 1306 may provide the data on the RAMDAT node to the data queue DQ (S1412), and the read operation is completed (S1417). The MUX 1306 may provide the data on the REDDAT node from the RECC 1311 to the data queue DQ (S1413), if the HIT signal is inactive "N". The controller circuit 1001 may check whether the ERR signal from the RECC 1311 is active (S1414). If the ERR signal from the RECC 1311 is not active "N", the read operation is completed (S1417). If the ERR signal is active "Y", the controller circuit 1001 may check the in-use flag information and the locked flag information, responsive to the ERR signal (S1415). If the in-use flag information and the locked flag information are indicative that all the CAM memory is used (CAM overflow="Y"), the controller circuit 1001 may skip writing the address in the CAM memory in the memory circuit 1304 and may end the writing operation (S1417). If the CAM memory is available (CAM overflow="N"), the controller circuit 1001 may control the plurality of memory circuits 1304 and 1305 by providing the CAMWE signal. The memory circuit 1304 may write the address to the GAM memory from the FIFO 1309 via the ERRADD node (S1416), responsive to the CAMWE signal. The memory circuit 1305 may store the data on the REDDAT node (S1416). The controller circuit 1001 may further set in-use flag information of the address (S1416). After the step in S1416, the read operation is completed (S1417). Thus, it is possible to provide remedy with the CAM memory based on the result of ECC function.

Logic levels of signals used in the embodiments described the above are merely examples. However, in other embodiments, combinations of the logic levels of signals other than those specifically described in the present disclosure may be used without departing from the scope of the present disclosure.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

What is claimed is:

1. An apparatus comprising:
   at least one memory chip comprising a plurality of memory cells; and
   an interface chip coupled to the at least one memory chip and comprising a control circuit and a storage area comprising static random access memory cells,
   wherein, during an initialization operation, the control circuit is configured to detect one or more defective memory cells of the plurality of memory cells of the at least one memory chip and, upon the detection of the one or more defective memory cells, to store first defective address information of the one or more defective memory cells into a portion of the static random memory cells of the storage area during the initialization operation, wherein a remaining portion of the static random access memory cells of the storage area serves as spare memory to replace the one or more defective cells during a normal operation of the interface chip.

2. The apparatus of claim 1, wherein the interface chip is configured to respond, at least in part, to the first defective address information and access the storage area in place of the at least one memory chip when an access request has been provided with respect to the one or more defective memory cells of the plurality of memory cells.

3. The apparatus of claim 2, wherein the control circuit is configured to perform a memory test operation in response to a power on signal of the apparatus, and further configured to detect the one or more defective memory cells of the plurality of memory cells in the memory test operation.

4. The apparatus of claim 3, wherein the at least one memory chip comprises a defective address storing circuit in which second defective address information is stored, the second defective address information for another one or more defective memory cells of the plurality of memory cells of the at least one memory chip.

5. The apparatus of claim 4, wherein the control circuit is configured to detect the other one or more defective memory cells of the plurality of memory cells to produce the second defective address information and configured to store the second defective address information in the storage area, and further configured to program the second defective address information into the defective address storing circuit of the at least one memory chip.

6. The apparatus of claim 2, wherein the storage area comprises a plurality of second memory cells that are different in type from the plurality of memory cells.

7. The apparatus of claim 1, wherein the at least one memory chip and the interface chip are stacked with each other.

8. The apparatus of claim 2, wherein the control circuit is configured to store access address information and corresponding data into the storage area along with providing the corresponding data to the at least one memory chip in a write operation and configured to respond to a read request to one or more cells of the plurality of memory cells designated by the access address information to compare the corresponding data stored in the storage area and the corresponding data provided from the at least one memory chip to determine whether the one or more cells of the plurality of memory cells designated by the access address information is defective or not.

9. The apparatus of claim 2, further comprising an error detection circuit configured to receive data from one or more cells of the plurality of memory cells and provide an error signal when the data include an error, and wherein the control circuit is configured to respond to the error signal to identify the one or more cells as the one or more defective cells and store access address information designating the one or more cells into the storage area as the first defective address information.

10. A method, comprising:
    detecting, by an interface chip of a semiconductor device, one or more defective memory cells of a memory chip of the semiconductor device during an initialization operation; and
    upon detecting the one or more defective memory cells, storing first address information of the one or more defective memory cells as defective address information in a portion of static random access memory cells in error correction memory of the interface chip during the initialization operation, wherein a remaining portion of the static random access memory cells in the error correction memory of the interface chip serves as spare memory to replace the one or more defective memory cells during a normal operation of the interface chip.

11. The method of claim 10, further comprising accessing one or more memory cells in the error correction memory responsive to an access request including second address information relevant to the one or more defective memory cells based on the defective address information.

12. The method of claim 10, wherein detecting the one or more defective memory cells of the memory chip comprises providing test write data, test access signal, and test address information responsive to test control signals, wherein the test access signal includes test write commands.

13. The method of claim 12, further comprises providing the test write data, the test access signal, and the test address information to the memory chip, the memory chip includes a memory cell corresponding to the test address information.

14. The method of claim 13, further comprising providing read commands and the test address information to a channel on the memory chip corresponding to the test address information.

15. The method of claim 14, further comprising:
receiving test read data from the channel;
comparing the test read data with expected data; and
providing a comparison result, wherein storing the first address information of the detected one or more defective memory cells as the defective address information is executed responsive to the comparison result.

16. The method of claim 15, further comprising receiving a power on signal, wherein the defective address information is stored in a defective address storing circuit responsive to the power on signal.

17. The method of claim 16, wherein the defective address storing circuit is in the memory chip.

18. The method of claim 15, further comprising: receiving the test control signals including a test instruction, wherein the defective address information is stored in the error correction memory responsive to the test control signals.

19. An interface chip of a semiconductor device comprising:
a test logic circuit; and
one or more static random access memories,
wherein the test logic circuit is configured to detect one or more defective memory cells of at least one memory chip of the semiconductor device, during an initialization operation,
wherein, upon detection of the one or more defective memory cells, a portion of the one or more static random access memories are configured to store first address information of the one or more defective memory cells as defective address information during the initialization operation and a remaining portion of the one or more static randome access memories serve as spare memory to replace the one or more defective memory cells during a normal operation of the interface chip.

20. The interface chip of claim 19, wherein the test logic circuit is configured to access one or more memory cells in the remaining portion of the one or more static random access memories responsive to an access request, when the test logic circuit determines that the access request includes second address information relevant to the one or more defective memory cells based on the defective address information.

* * * * *